United States Patent
Sun et al.

(10) Patent No.: US 12,429,762 B2
(45) Date of Patent: Sep. 30, 2025

(54) METHOD OF FORMING A LAYOUT PATTERN AND PHOTOMASK

(71) Applicant: United Microelectronics Corp., Hsinchu (TW)

(72) Inventors: Chia-Chen Sun, Kaohsiung (TW); En-Chiuan Liou, Tainan (TW); Song-Yi Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 498 days.

(21) Appl. No.: 18/165,937

(22) Filed: Feb. 8, 2023

(65) Prior Publication Data

US 2024/0210816 A1 Jun. 27, 2024

(30) Foreign Application Priority Data

Dec. 26, 2022 (CN) .......................... 202211678104.9

(51) Int. Cl.
*G03F 1/70* (2012.01)
*G03F 1/36* (2012.01)
*G03F 7/00* (2006.01)
*G06F 30/392* (2020.01)

(52) U.S. Cl.
CPC .................. *G03F 1/70* (2013.01); *G03F 1/36* (2013.01); *G03F 7/70441* (2013.01); *G06F 30/392* (2020.01)

(58) Field of Classification Search
CPC ........... G03F 1/70; G03F 1/36; G03F 7/70441
See application file for complete search history.

(56) References Cited

U.S. PATENT DOCUMENTS

| | | | |
|---|---|---|---|
| 6,998,205 B2 | 2/2006 | Huang | |
| 7,479,355 B1 | 1/2009 | Chen et al. | |
| 7,569,310 B2 | 8/2009 | Wallace et al. | |
| 7,632,610 B2 | 12/2009 | Wallace et al. | |
| 7,695,871 B2* | 4/2010 | van Adrichem | G03F 1/26 430/5 |
| 10,139,723 B2* | 11/2018 | Wei | G03F 1/84 |
| 10,943,054 B2* | 3/2021 | Liao | G06F 30/367 |
| 2007/0234246 A1 | 10/2007 | Sinha et al. | |
| 2015/0128099 A1* | 5/2015 | Yang | G03F 1/36 716/55 |

* cited by examiner

*Primary Examiner* — Stewart A Fraser
(74) *Attorney, Agent, or Firm* — JCIPRNET

(57) ABSTRACT

A method includes providing a layout pattern to a computer system. The layout pattern includes a first pattern, a second pattern, and a third pattern. A central line defined by connecting a line end of the second pattern and a line end of the third pattern overlaps with a middle portion of the first pattern. An optical proximity correction (OPC) is performed on the layout pattern to form a first auxiliary pattern. The first auxiliary pattern includes a first stripe pattern and a second stripe pattern both extending from the line end of the second pattern. The second stripe pattern is closer to the first pattern than the first stripe pattern, and an extending length of the second stripe pattern is less than an extending length of the first stripe pattern. The layout pattern and the first auxiliary pattern are outputted through the computer system onto a photomask.

16 Claims, 4 Drawing Sheets

METHOD OF FORMING A LAYOUT PATTERN AND PHOTOMASK

CROSS-REFERENCE TO RELATED APPLICATION

This application claims the priority benefit of China application serial No. 202211678104.9, filed on Dec. 26, 2022. The entirety of the above-mentioned patent application is hereby incorporated by reference herein and made a part of this specification.

BACKGROUND OF THE INVENTION

Field of the Invention

The invention relates to a method of forming a layout pattern and a photomask.

Description of Related Art

The current semiconductor process first forms the design pattern of integrated circuits on a photomask, and then transfers the pattern on the photomask to the target layer (e.g., photoresist layer) on the semiconductor chip in a certain proportion through exposure and development steps, and further forms the devices gradually on the semiconductor chip with the relevant etching process.

As the integration density of the integrated circuits increases and the size of devices shrinks, when performing pattern transfer, since the critical dimension (CD) of the line segments that can be fabricated by exposure will be limited by the resolution limit of the optical exposure tool, it is very easy to produce optical proximity effect when exposing these highly densely arranged photomask patterns to form photoresist patterns. The optical proximity effect makes the patterns formed on the photoresist layer result in the resolution loss due to overexposure or underexposure, thereby causing the patterns on the photomask to be inconsistent with the patterns on the photoresist layer, and finally causing the patterns on the photoresist layer will be very different from the original design dimensions.

SUMMARY OF THE INVENTION

The present invention provides a method of forming a layout pattern and a photomask. In the case of a layout in which the middle linear pattern is sandwiched between two line end patterns, an asymmetric auxiliary pattern is added into two line end patterns by using the optical proximity correction (OPC) calculation to increase the process window and resolve the issue of necking or disconnection of the middle linear pattern.

The present invention provides a method of forming a layout pattern including: providing a layout pattern to a computer system. The layout pattern includes: a first pattern having a first side and a second side opposite to each other; a second pattern disposed at the first side of the first pattern; and a third pattern disposed at the second side of the first pattern, wherein a central line defined by connecting a line end of the second pattern and a line end of the third pattern overlaps with a middle portion of the first pattern. An optical proximity correction (OPC) calculation is performed on the layout pattern to form a first auxiliary pattern on the line end of the second pattern and form a second auxiliary pattern on the line end of the third pattern. The first auxiliary pattern includes: a first stripe pattern extending from the line end of the second pattern along a first direction; and a second stripe pattern extending from the line end of the second pattern along the first direction; and spaced from and not contracting the first stripe pattern in a second direction. The second stripe pattern is closer to the first pattern than the first stripe pattern, and an extending length of the second stripe pattern is less than an extending length of the first stripe pattern. The layout pattern, the first auxiliary pattern, and the second auxiliary pattern are outputted through the computer system onto a photomask.

In an embodiment pf the present invention, a ratio of the extending length of the first stripe pattern to the extending length of the second stripe pattern is between 1.5 and 3.0.

In an embodiment of the present invention, the first direction is substantially perpendicular to the second direction.

In an embodiment of the present invention, the second auxiliary pattern includes: a third stripe pattern extending from the line end of the third pattern along a third direction; and a fourth stripe pattern extending from the line end of the third pattern along the third direction, and spaced from and not contacting the third stripe pattern in the second direction, wherein the fourth stripe pattern is closer to the first pattern than the third stripe pattern, and an extending length of the fourth stripe pattern is less than an extending length of the third stripe pattern.

In an embodiment of the present invention, a ratio of the extending length of the third stripe pattern to the extending length of the fourth stripe pattern is between 1.5 and 3.0.

In an embodiment of the present invention, the third direction is substantially perpendicular to the second direction.

In an embodiment of the present invention, the first direction is opposite to the third direction.

In an embodiment of the present invention, the first pattern, the second pattern, and the third pattern are arranged in parallel in the second direction.

In an embodiment of the present invention, the method further includes: transferring the layout pattern from the photomask to a material layer through a photolithography process with the photomask, wherein the first auxiliary pattern and the second auxiliary pattern are not transferred to the material layer.

The present invention provides a photomask including: a substrate, a layout pattern, a first auxiliary pattern, and a second auxiliary pattern. The layout pattern is disposed on the substrate. The layout pattern includes: a first pattern having a first side and a second side opposite to each other; a second pattern disposed at the first side of the first pattern; and a third pattern disposed at the second side of the first pattern, wherein a central line defined by connecting a line end of the second pattern and a line end of the third pattern overlaps with a middle portion of the first pattern. The first auxiliary pattern is disposed on the line end of the second pattern. The first auxiliary pattern includes: a first stripe pattern extending from the line end of the second pattern along a first direction; and a second stripe pattern extending from the line end of the second pattern along the first direction, and spaced from and not contacting the first stripe pattern, wherein the second stripe pattern is closer to the first pattern than the first stripe pattern, and an extending length of the second stripe pattern is less than an extending length of the first stripe pattern. The second auxiliary pattern is disposed on the line end of the third pattern. The second auxiliary pattern includes: a third stripe pattern extending from the line end of the third pattern along a third direction; and a fourth stripe pattern extending from the line end of the third pattern along the third direction, and spaced from and not contacting the third stripe pattern, wherein the fourth stripe pattern is closer to the first pattern than the third stripe pattern, and an extending length of the fourth stripe pattern is less than an extending length of the third stripe pattern.

In an embodiment of the present invention, a ratio of the extending length of the first stripe pattern to the extending length of the second stripe pattern is between 1.5 and 3.0.

In an embodiment of the present invention, the first direction is substantially perpendicular to the second direction.

In an embodiment of the present invention, a ratio of the extending length of the third stripe pattern to the extending length of the fourth stripe pattern is between 1.5 and 3.0.

In an embodiment of the present invention, the third direction is substantially perpendicular to the second direction.

In an embodiment of the present invention, the first direction is opposite to the third direction.

In an embodiment of the present invention, the first pattern, the second pattern, and the third pattern are arranged in parallel in the second direction.

To provide a further understanding of the aforementioned and other features and advantages of the disclosure, exemplary embodiments, together with the reference drawings, are described in detail below.

DESCRIPTION OF THE EMBODIMENTS

Figure 1:
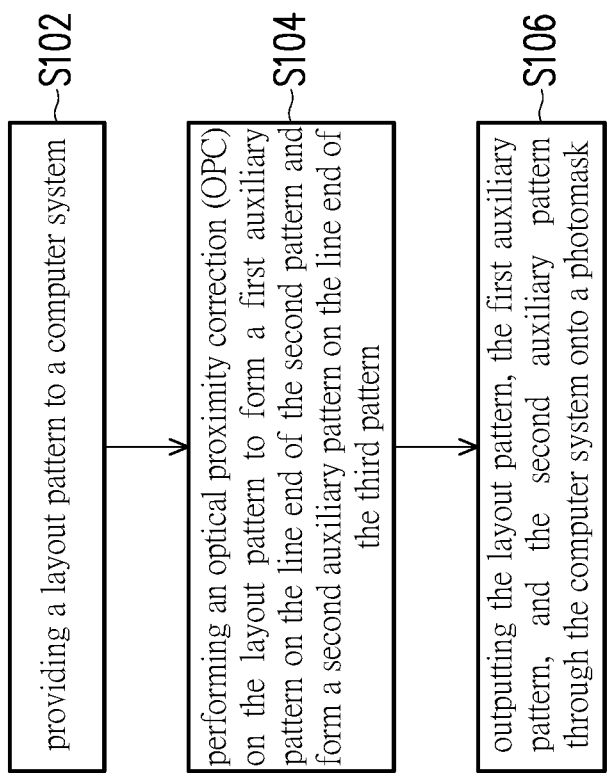
FIG. 1 is a schematic flowchart of a method of forming a layout pattern according to an embodiment of the present invention.

The invention will be described in detail with reference to the drawings of the embodiments. However, the invention may also be implemented in various different forms and shall not be limited to the embodiments described herein. Thicknesses of layers and regions in the drawings are exaggerated for clarity. The same or similar numerals represent the same or similar devices, which will not be repeatedly described in subsequent paragraphs.

Figure 2:
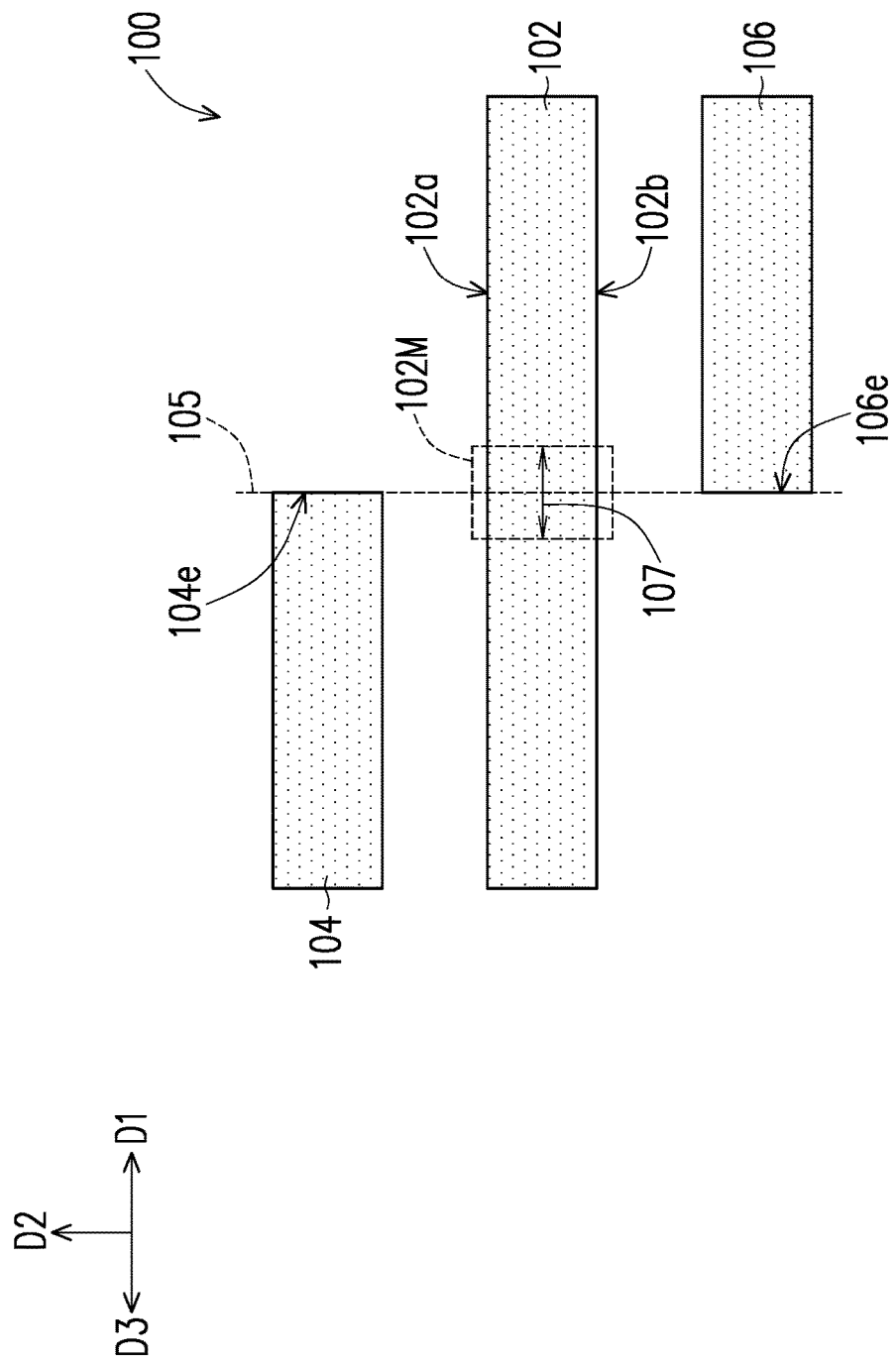
FIG. 2 is a schematic top view of a layout pattern according to an embodiment of the present invention.
Figure 3:
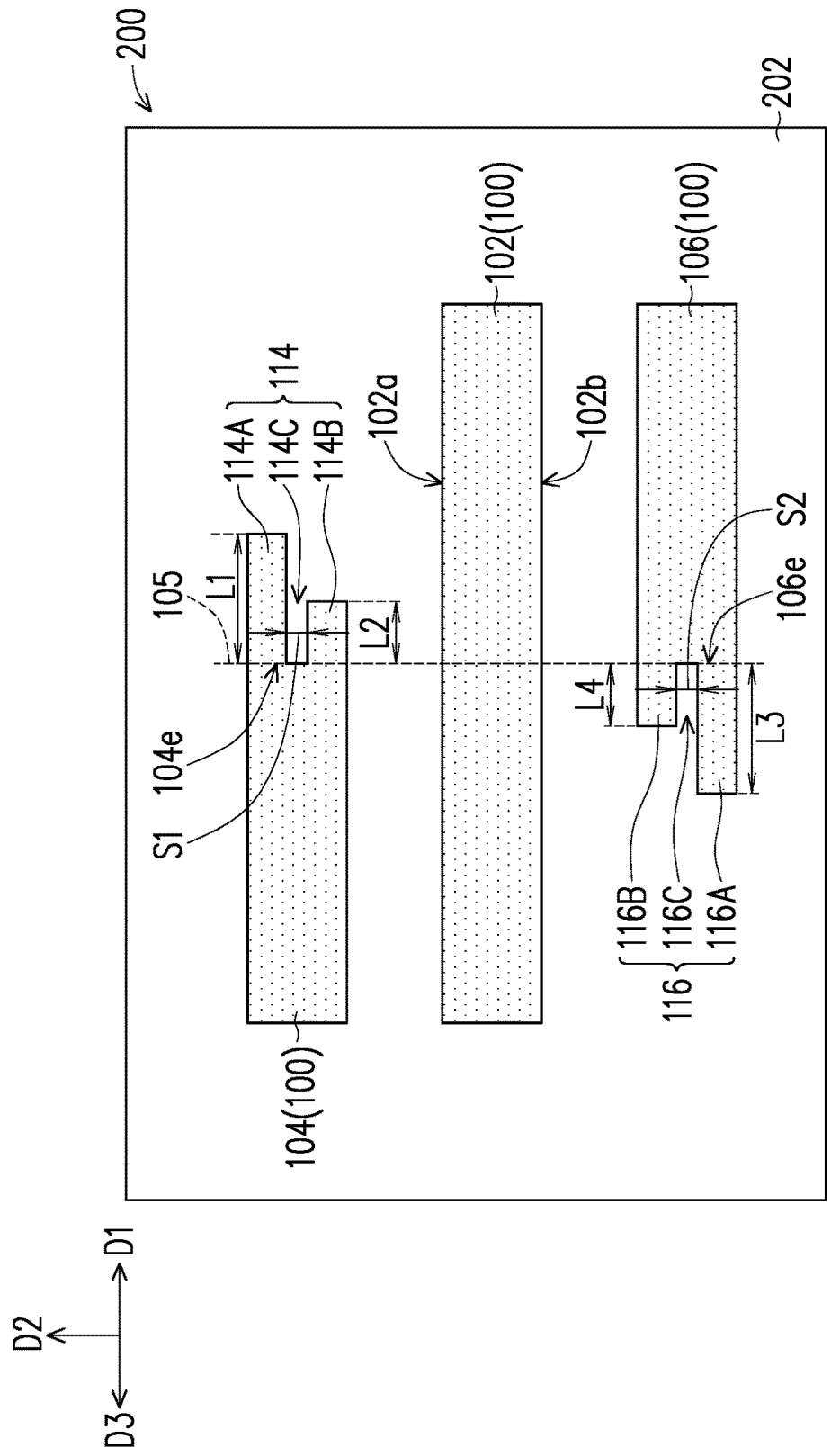
FIG. 3 is a schematic top view of a photomask according to an embodiment of the present invention.

FIG. 1 is a schematic flowchart of a method of forming a layout pattern according to an embodiment of the present invention. FIG. 2 is a schematic top view of a layout pattern according to an embodiment of the present invention. FIG. 3 is a schematic top view of a photomask according to an embodiment of the present invention.

Referring to FIG. 1 to FIG. 3, the present embodiment provides a method of forming a layout pattern including the following steps. First a step S102 is performed to provide a layout pattern 100 to a computer system. In one embodiment, the layout pattern 100 refers to a pattern to be subsequently transferred to a target layer (not shown) on a photomask or a semiconductor chip, and the pattern may include any feature pattern used to form an integrated circuit (IC) such as a doped region pattern, a device pattern, a metal routing pattern, or the like. In the present embodiment, the layout pattern 100 includes at least one area of the metal interconnect pattern.

Specifically, the layout pattern 100 may include a first pattern 102, a second pattern 104, and a third pattern 106. As shown in FIG. 2, the first pattern 102, the second pattern 104, and the third pattern 106 are all linear patterns extending along a first direction D1, and are arranged in parallel in a second direction D2. In one embodiment, the first direction D1 is substantially perpendicular to the second direction D2. The first pattern 102 may have a first side 102a and a second side 102b opposite to each other. For example, the first side 102a of the first pattern 102 may be the upper side, while the second side 102b of the first pattern 102 may be the lower side, but the present invention is not limited thereto. The second pattern 104 may be arranged at the first side 102a of the first pattern 102 and is separated from the first pattern 102 in the second direction D2 without contacting each other. The third pattern 106 may be arranged at the second side 102b of the first pattern 102 and is separated from the first pattern 102 in the second direction D2 without contacting each other. That is, the first pattern 102 may be sandwiched between the second pattern 104 and the third pattern 106.

It should be noted that, in the present embodiment, a center line 105 defined by connecting a line end 104e of the second pattern 104 and a line end 106e of the third pattern 106 overlaps with a middle portion 102M of the first pattern 102. In this case, after performing the photolithography process and/or the etching process, the middle linear pattern (e.g., the first pattern 102) is prone to necking and even disconnection. In addition, the edges of the line end patterns (e.g., the second pattern 104 and the third pattern 106) will also shrink after the photolithography process and/or the etching process and cannot reach the predetermined position (e.g., the center line 105), which will cause the subsequently formed conductive vias to fail to be completely standing on the line end patterns, thereby affecting the resistance-capacitance (RC) performance. Therefore, the present invention avoids the above issues by performing an optical proximity correction operation on the layout pattern 100. Further, although the line end 104e, the line end 106e, and the center line 105 illustrated in FIG. 2 are vertically aligned with each other, the present invention is not limited thereto. In other embodiments, the line end 104e and the line end 106e may protrude or indent from the center line 105 by a certain distance. That is, as long as the line end 104e and line end 106e fall within the range of the middle portion 102M of the first pattern 102, it is within the protection scope of the present invention. In the present embodiment, a width 107 of the middle portion 102M may be, for example, 40 nm. In other words, the line end 104e, the line end 106e may be located in a range of the center line 105 with a lateral distance of ±20 nm.

Next, a step S104 is performed to perform an optical proximity correction operation on the layout pattern 100, so as to form a first auxiliary pattern 114 on the line end 104e of the second pattern 104, and form a second auxiliary pattern 116 on the line end 106e of the third pattern 106. Specifically, as shown in FIG. 3, the first auxiliary pattern 114 may include a first strip pattern 114A and a second strip pattern 114B. In one embodiment, the first strip pattern 114A and the second strip pattern 114B both extend from the line end 104e of the second pattern 104 along the first direction D1, and the first strip pattern 114A is separated from and not in contact with the second strip pattern 114B in the second direction D2. That is, there is a recess 114C between the first strip pattern 114A and the second strip pattern 114B, and the recess 114C may physically separate the first strip pattern 114A and the second strip pattern 114B. In one embodiment, the recess 114C may have a non-zero space S1, and the non-zero space S1 may be between 7 nm and 20 nm, such as 14 nm.

It should be noted that, in the present embodiment, the second strip pattern 114B is closer to the first side 102a of the first pattern 102 than the first strip pattern 114A, and an extending length L2 of the second strip pattern 114B is less than an extending length L1 of the first strip pattern 114A. In this case, the longer first strip pattern 114A can effectively extend the edge of the exposed photoresist pattern corresponding to the second pattern 104, so that the edge of the exposed photoresist pattern will not shrink to reach the predetermined location (e.g., the center line 105). Therefore, the subsequently formed conductive vias can completely stand on the wire pattern corresponding to the second pattern 104, thereby improving the RC performance. In addition, the shorter second strip pattern 114B can effectively avoid the issue of necking or even disconnection of the exposed photoresist pattern corresponding to the first pattern 102, thereby improving reliability of the device. Further, the recess 114C of the present embodiment can be used to reduce the exposure energy of the photolithography process, so as to avoid the excessively high exposure energy which affects the shape of the exposed photoresist pattern corresponding to the first pattern 102, thereby preventing the exposed photoresist pattern from necking and even occurring the disconnection issue. In one embodiment, a ratio (L1/L2) of the extending length L1 of the first strip pattern 114A to the extending length L2 of the second strip pattern 114B is between 1.5 and 3.0.

On the other hand, the second auxiliary pattern 116 may include a third strip pattern 116A and a fourth strip pattern 116B. In one embodiment, the third strip pattern 116A and the fourth strip pattern 116B both extend from the line end 106e of the third pattern 106 along a third direction D3, and the third strip pattern 116A is separated from and not in contact with the fourth strip pattern 116B in the second direction D2. That is, there is a recess 116C between the third strip pattern 116A and the fourth strip pattern 116B, and the recess 116C may physically separate the third strip pattern 116A and the fourth strip pattern 116B. In one embodiment, the recess 116C may have a non-zero space S2, and the non-zero space S2 may be between 7 nm and 20 nm, for example, 14 nm. It should be noted that, in the present embodiment, the fourth strip pattern 116B is closer to the second side 102b of the first pattern 102 than the third strip pattern 116A, and an extending length L4 of the fourth strip pattern 116B is less than an extending length of the third strip pattern 116A L3. In one embodiment, the third direction D3 is substantially perpendicular to the second direction D2, and the first direction D1 is opposite to the third direction D3.

As mentioned above, in the present embodiment, the longer third stripe pattern 116A can effectively extend the edge of the exposed photoresist pattern corresponding to the third pattern 106, so that the edge of the exposed photoresist pattern will not shrink to reach the predetermined location (e.g., the center line 105). Therefore, the subsequently formed conductive vias can completely stand on the wire pattern corresponding to the third pattern 106, thereby improving the RC performance. In addition, the shorter fourth strip pattern 116B can effectively avoid the issue of necking or even disconnection of the exposed photoresist pattern corresponding to the first pattern 102, thereby improving the reliability of the device. Further, the recess 116C of the present embodiment can be used to reduce the exposure energy of the photolithography process, so as to avoid the excessively high exposure energy which affects the shape of the exposed photoresist pattern corresponding to the first pattern 102, thereby preventing the exposed photoresist pattern from necking and even occurring the disconnection issue. In one embodiment, a ratio (L3/L4) of the extending length L3 of the third strip pattern 116A to the extending length L4 of the fourth strip pattern 116B is between 1.5 and 3.0.

Then, a step S106 is performed, and the layout pattern 100, the first auxiliary pattern 114 and the second auxiliary pattern 116 are outputted through the computer system to a photomask 200, as shown in FIG. 3. The photomask 200 may transfer the layout pattern 100 from the photomask 200 to a target layer or a material layer through a photolithography process. It should be noted that the first auxiliary pattern 114 and the second auxiliary pattern 116 are not transferred to the target layer or the material layer after the photolithography process, and the first auxiliary pattern 114 and the second auxiliary pattern 116 are only used to adjust the exposure energy distribution of the photolithography process, so that the exposed first pattern 102, the exposed second pattern 104, and the exposed third pattern 106 are closer to the design in the original layout pattern 100. That is, the first pattern 102, the second pattern 104, and the third pattern 106 may be regarded as printable patterns, while the first auxiliary pattern 114 and the second auxiliary pattern 116 may be regarded as non-printable patterns.

In the present embodiment, the photomask 200 may include a substrate 202, the layout pattern 100, the first auxiliary pattern 114, and the second auxiliary pattern 116. The substrate 202 may include a transparent substrate, such as a quartz substrate, a glass substrate, a plastic substrate, a ceramic substrate, or a substrate formed of other suitable materials. The layout pattern 100 is disposed on substrate 202. The layout pattern 100 includes the first pattern 102, the second pattern 104, and the third pattern 106. The second pattern 104 is disposed at the first side 102a of the first pattern 102, and the third pattern 106 is disposed at the second side 102b of the first pattern 102. The center line 105 defined by connecting the line end 104e of the second pattern 104 and the line end 106e of the third pattern 106 overlaps with the middle portion 102M of the first pattern 102. The first auxiliary pattern 114 is disposed on the line end 104e of the second pattern 104, and the second auxiliary pattern 116 is disposed on the line end 106e of the third pattern 106. The first auxiliary pattern 114 may include a first strip pattern 114A and a second strip pattern 114B extending from the line end 104e of the second pattern 104 along the first direction D1. The first strip pattern 114A is physically separated from the second strip pattern 114B in the second direction D2 by the recess 114C. In the present embodiment, the second strip pattern 114B is closer to the first side 102a of the first pattern 102 than the first strip pattern 114A, and the extending length L2 of the second strip pattern 114B is less than the extending length L1 of the first strip pattern 114A. On the other hand, the second auxiliary pattern 116 may include a third strip pattern 116A and a fourth strip pattern 116B extending from the line end 106e of the third pattern 106 along the third direction D3. The third strip pattern 116A is physically separated from the fourth strip pattern 116B in the second direction D2 by the recess 116C. In the present embodiment, the fourth strip pattern 116B is closer to the second side 102b of the first pattern 102 than the third strip pattern 116A, and the extending length L4 of the fourth strip pattern 116B is less than the extending length L3 of the third strip pattern 116A.

Figure 4:
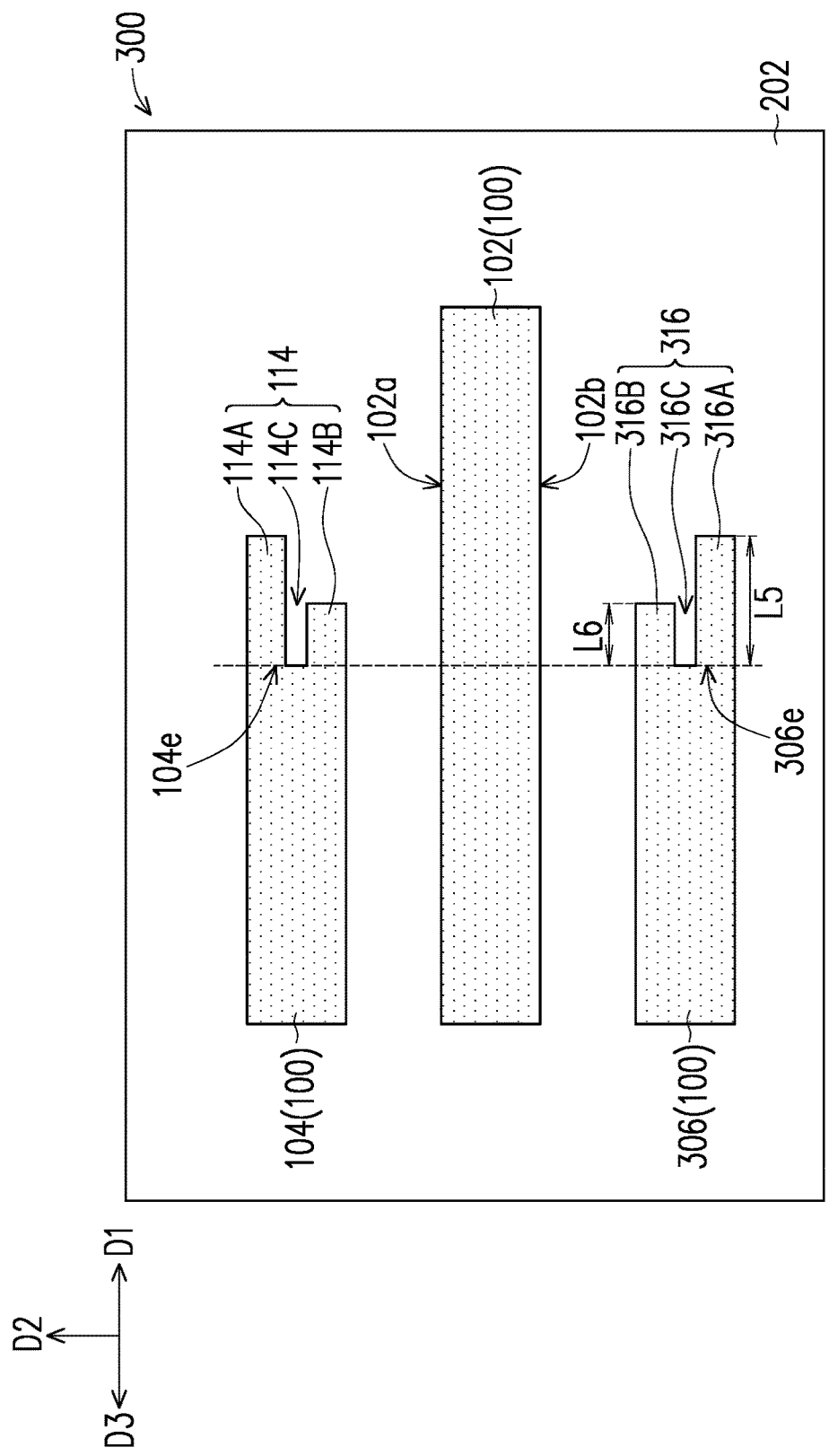
FIG. 4 is a schematic top view of a photomask according to another embodiment of the present invention.

FIG. 4 is a schematic top view of a photomask according to another embodiment of the present invention.

A photomask 300 illustrated in FIG. 4 is similar to the photomask 200 illustrated in FIG. 3, and similar components and configurations have been described in detail in the above paragraphs, and will not be repeated here. The main difference between the photomask 300 and the photomask 200 lies in that the second pattern 104 (or the first auxiliary pattern 114) and a third pattern 306 (or a second auxiliary pattern 316) of the photomask 300 are arranged in a mirror configuration through the first pattern 102. Specifically, the second auxiliary pattern 316 extends from a line end 306e of the third pattern 306 along the first direction D1. That is, the second auxiliary pattern 316 has the same extension direction as the first auxiliary pattern 114. In one embodiment, the second auxiliary pattern 316 may include a third strip pattern 316A and a fourth strip pattern 316B. The third strip pattern 316A is physically separated from the fourth strip pattern 316B in the second direction D2 by a recess 316C. In the present embodiment, the fourth strip pattern 316B is closer to the second side 102b of the first pattern 102 than the third strip pattern 316A, and an extending length L6 of the fourth strip pattern 316B is less than an extending length L5 of the third strip pattern 316A. In one embodiment, a ratio (L5/L6) of the extending length L5 of the third strip pattern 316A to the extending length L6 of the fourth strip pattern 316B is between 1.5 and 3.0.

To sum up, in the embodiment of the present invention, in the case of a layout in which the middle linear pattern is sandwiched between two line end patterns, an asymmetric auxiliary pattern is added to two line end patterns by using the optical proximity correction (OPC) calculation to increase the process window and resolve the issue of necking or disconnection of the middle linear pattern, thereby improving the reliability of the device. Further, the edge of the exposed line end pattern will not shrink and can reach the predetermined position. Therefore, the subsequently formed conductive vias can completely stand on the line end pattern, thereby improving the RC performance.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A method of forming a layout pattern, comprising:
providing a layout pattern to a computer system, wherein the layout pattern comprises:
a first pattern having a first side and a second side opposite to each other;
a second pattern disposed at the first side of the first pattern; and
a third pattern disposed at the second side of the first pattern, wherein a central line defined by connecting a line end of the second pattern and a line end of the third pattern overlaps with a middle portion of the first pattern;
performing an optical proximity correction (OPC) calculation on the layout pattern to form a first auxiliary pattern on the line end of the second pattern and form a second auxiliary pattern on the line end of the third pattern, wherein the first auxiliary pattern comprises:
a first stripe pattern extending from the line end of the second pattern along a first direction; and
a second stripe pattern extending from the line end of the second pattern along the first direction, and spaced from and not contacting the first stripe pattern in a second direction, wherein the second stripe pattern is closer to the first pattern than the first stripe pattern, and an extending length of the second stripe pattern is less than an extending length of the first stripe pattern; and
outputting the layout pattern, the first auxiliary pattern, and the second auxiliary pattern through the computer system onto a photomask.

2. The method of claim 1, wherein a ratio of the extending length of the first stripe pattern to the extending length of the second stripe pattern is between 1.5 and 3.0.

3. The method of claim 1, wherein the first direction is substantially perpendicular to the second direction.

4. The method of claim 1, wherein the second auxiliary pattern comprises:
a third stripe pattern extending from the line end of the third pattern along a third direction; and
a fourth stripe pattern extending from the line end of the third pattern along the third direction, and spaced from and not contacting the third stripe pattern in the second direction, wherein the fourth stripe pattern is closer to the first pattern than the third stripe pattern, and an extending length of the fourth stripe pattern is less than an extending length of the third stripe pattern.

5. The method of claim 4, wherein a ratio of the extending length of the third stripe pattern to the extending length of the fourth stripe pattern is between 1.5 and 3.0.

6. The method of claim 4, wherein the third direction is substantially perpendicular to the second direction.

7. The method of claim 4, wherein the first direction is opposite to the third direction.

8. The method of claim 1, wherein the first pattern, the second pattern, and the third pattern are arranged in parallel in the second direction.

9. The method of claim 1, further comprising: transferring the layout pattern from the photomask to a material layer through a photolithography process with the photomask, wherein the first auxiliary pattern and the second auxiliary pattern are not transferred to the material layer.

10. A photomask, comprising:
a substrate;
a layout pattern disposed on the substrate, wherein the layout pattern comprises:
a first pattern having a first side and a second side opposite to each other;
a second pattern disposed at the first side of the first pattern; and
a third pattern disposed at the second side of the first pattern, wherein a central line defined by connecting a line end of the second pattern and a line end of the third pattern overlaps with a middle portion of the first pattern;
a first auxiliary pattern disposed on the line end of the second pattern, wherein the first auxiliary pattern comprises:
a first stripe pattern extending from the line end of the second pattern along a first direction; and
a second stripe pattern extending from the line end of the second pattern along the first direction, and spaced from and not contacting the first stripe pattern, wherein the second stripe pattern is closer to the first pattern than the first stripe pattern, and an extending length of the second stripe pattern is less than an extending length of the first stripe pattern; and a second auxiliary pattern disposed on the line end of the third pattern, wherein the second auxiliary pattern comprises:
a third stripe pattern extending from the line end of the third pattern along a third direction; and
a fourth stripe pattern extending from the line end of the third pattern along the third direction, and spaced from and not contacting the third stripe pattern, wherein the fourth stripe pattern is closer to the first pattern than the third stripe pattern, and an extending length of the fourth stripe pattern is less than an extending length of the third stripe pattern.

11. The photomask of claim 10, wherein a ratio of the extending length of the first stripe pattern to the extending length of the second stripe pattern is between 1.5 and 3.0.

12. The photomask of claim 10, wherein the first direction is substantially perpendicular to the second direction.

13. The photomask of claim 10, wherein a ratio of the extending length of the third stripe pattern to the extending length of the fourth stripe pattern is between 1.5 and 3.0.

14. The photomask of claim 10, wherein the third direction is substantially perpendicular to the second direction.

15. The photomask of claim 10, wherein the first direction is opposite to the third direction.

16. The photomask of claim 10, wherein the first pattern, the second pattern, and the third pattern are arranged in parallel in the second direction.

\* \* \* \* \*